(12) United States Patent
Ng et al.

(10) Patent No.: US 7,302,181 B2
(45) Date of Patent: Nov. 27, 2007

(54) SINGLE LENS MULTIPLE LIGHT SOURCE DEVICE

(75) Inventors: Peng Yam Ng, Singapore (SG); Wee Sin Tan, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 743 days.

(21) Appl. No.: 10/374,245

(22) Filed: Feb. 25, 2003

(65) Prior Publication Data
US 2004/0165277 A1    Aug. 26, 2004

(51) Int. Cl.
H04J 14/02    (2006.01)
H04B 10/00    (2006.01)
G02B 3/00    (2006.01)
G02B 9/00    (2006.01)
G02B 17/00    (2006.01)

(52) U.S. Cl. ............... 398/88; 398/118; 398/128; 359/642; 359/664; 359/708; 359/728

(58) Field of Classification Search ............. 398/88, 398/106, 118, 130, 135, 128, 19; 359/362–435, 359/642–664, 672, 707–711, 728
See application file for complete search history.

(56) References Cited

U.S. PATENT DOCUMENTS

| | | | |
|---|---|---|---|
| 3,903,218 A * | 9/1975 | Humphrey | ............... 264/1.7 |
| 4,190,767 A | 2/1980 | Crouse | |
| 4,691,101 A | 9/1987 | Leonard | |
| 4,915,484 A | 4/1990 | Yamamoto | |
| 329,193 A | 9/1992 | Togami et al. | |
| 5,241,172 A | 8/1993 | Lugaresi | |
| 5,289,082 A | 2/1994 | Komoto | |
| 5,291,038 A | 3/1994 | Hanamoto et al. | |
| 5,317,149 A | 5/1994 | Uebbing et al. | |
| 5,495,358 A | 2/1996 | Bartig et al. | |
| 5,589,930 A * | 12/1996 | Kurahashi et al. | ......... 356/5.01 |
| 5,841,177 A | 11/1998 | Komoto et al. | |
| 5,898,267 A | 4/1999 | McDermott | |
| 5,986,788 A * | 11/1999 | Sasaki et al. | ............... 398/118 |
| 6,335,548 B1 | 1/2002 | Roberts et al. | |
| 6,410,911 B1 | 6/2002 | Omi | |
| 6,617,615 B1 | 9/2003 | Ueda | |
| 6,627,869 B2 * | 9/2003 | Tanaka et al. | ............... 250/216 |
| 6,876,471 B1 * | 4/2005 | Konno | ........................ 358/500 |

(Continued)

FOREIGN PATENT DOCUMENTS

JP    61254915 A    11/1986

(Continued)

OTHER PUBLICATIONS

U.S. Appl. No. 10/344,836, filed Jun. 13, 2003, Kee-Yean Ng. Co-pending application.

(Continued)

*Primary Examiner*—M. R. Sedighian (57) ABSTRACT

An optical communication device having multiple light sources under a single lens. The optical communication device has two light sources. The optical communication device has a lens optically coupled to the two light sources. The lens is shaped to direct light from the two light sources towards an axis of the lens. The optical communication device further has a third light source located below the approximate center of the lens.

14 Claims, 13 Drawing Sheets

U.S. PATENT DOCUMENTS 6,979,104 B2 *  12/2005  Brass et al. .................. 362/231
2003/0156842 A1 *  8/2003  Morimoto et al. .......... 398/107

FOREIGN PATENT DOCUMENTS

| JP | 01109317 A | 4/1989 |
| JP | 05029660 A | 2/1993 |
| JP | 6224859 | 11/1993 |
| JP | 6-12677 * | 6/1994 |
| JP | 09258099 A | 10/1997 |
| JP | 10-178393 | 6/1998 |
| JP | 2000-294832 | 10/2000 |
| JP | 2000-294838 | 10/2000 |

OTHER PUBLICATIONS

Japanese Office Action respecting co-pending Japanese equivalent to U.S. Appl. No. 10/374,245 (the present application)—in Japanese.

Japanese Office Action respecting co-pending Japanese equivalent to U.S. Appl. No. 10/374,245 (the present application)—English translation.

* cited by examiner

SINGLE LENS MULTIPLE LIGHT SOURCE DEVICE

TECHNICAL FIELD

Embodiments in accordance with the present invention relate to the field of transceivers. Specifically, embodiments in accordance with the present invention relate to a communication device having multiple light sources under a single lens.

BACKGROUND ART

One conventional technique for sharing data between electronic devices is the use of a light emitting diode (LED) and a photodetector. For example, devices such as personal digital assistants, mobile telephones, and laptop computers may exchange information if each has a transceiver with an LED and a photodetector.

Figure 1:
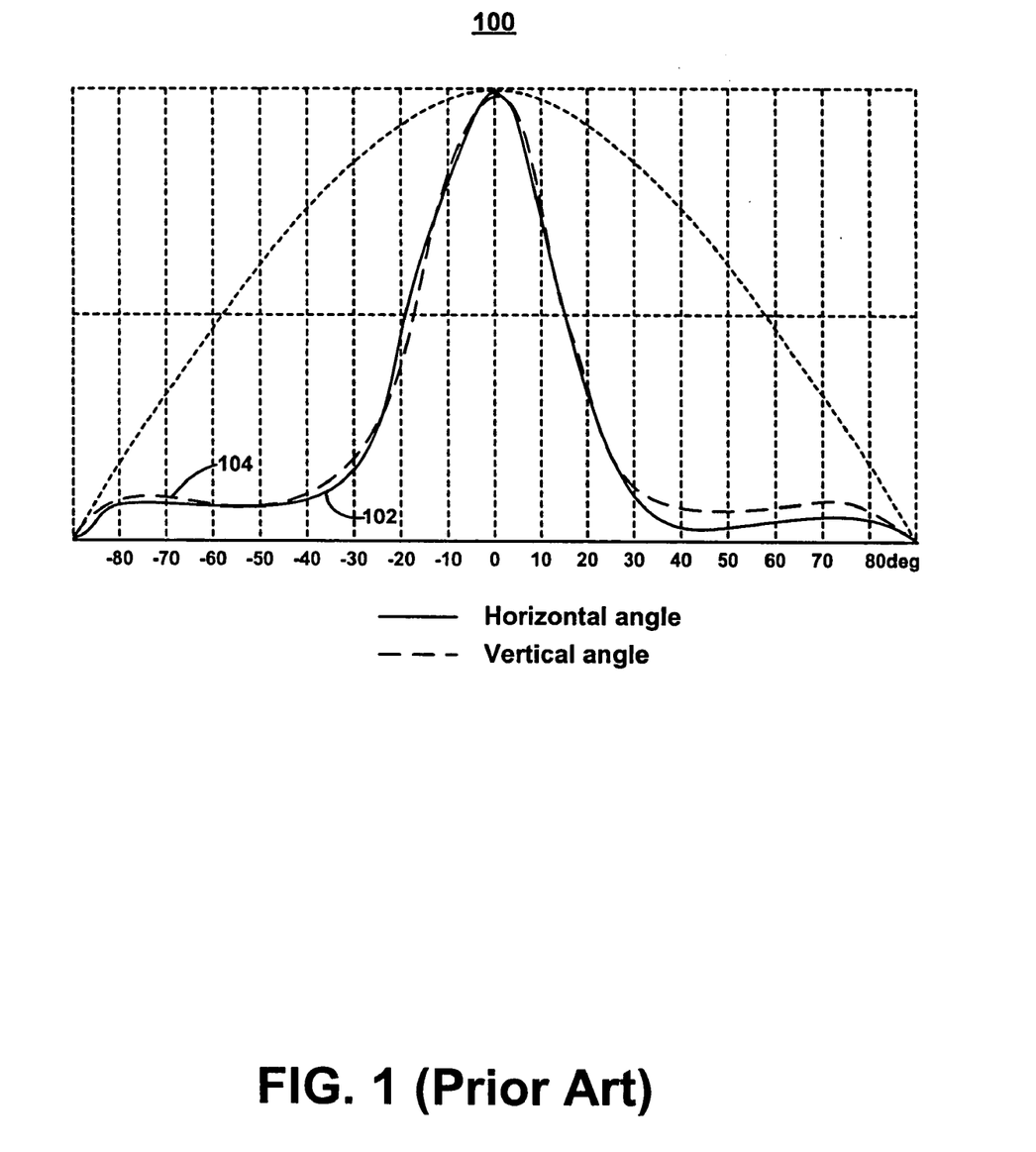
FIG. 1 is a light intensity profile of a conventional LED covered by a spherical lens.

Internally, conventional transceivers have a receiver circuit, a transmitter circuit, and a signal processor circuit. The transceiver has, on one of its external faces, a photodetector for reception and an LED under a lens for transmission. Prior art FIG. 1 shows a graph 100 of exemplary simulated light intensity profiles for an LED under a spherical lens. The graph 100 shows a horizontal light intensity (HA) curve 102 for light measured along an axis horizontal with respect to the lens and a vertical light intensity (VA) curve 104 for light measured along an axis vertical with respect to the lens. The HA curve 102 and VA curve 104 illustrate the light intensity at an arbitrary distance from the lens over angles between −90 to 90 degrees. The zero degree angle refers to a line that is straight out from the lens and through its central axis. FIG. 1 shows that both the HA curve 102 and the VA curve 104 peak at the central axis (0 degrees). Moreover, the half intensity point of each curve is more than 15 degrees from the central axis. Thus, the device provides good intensity over a cone whose sides extend at an angle of 15 degrees from the central axis.

Figure 2A:
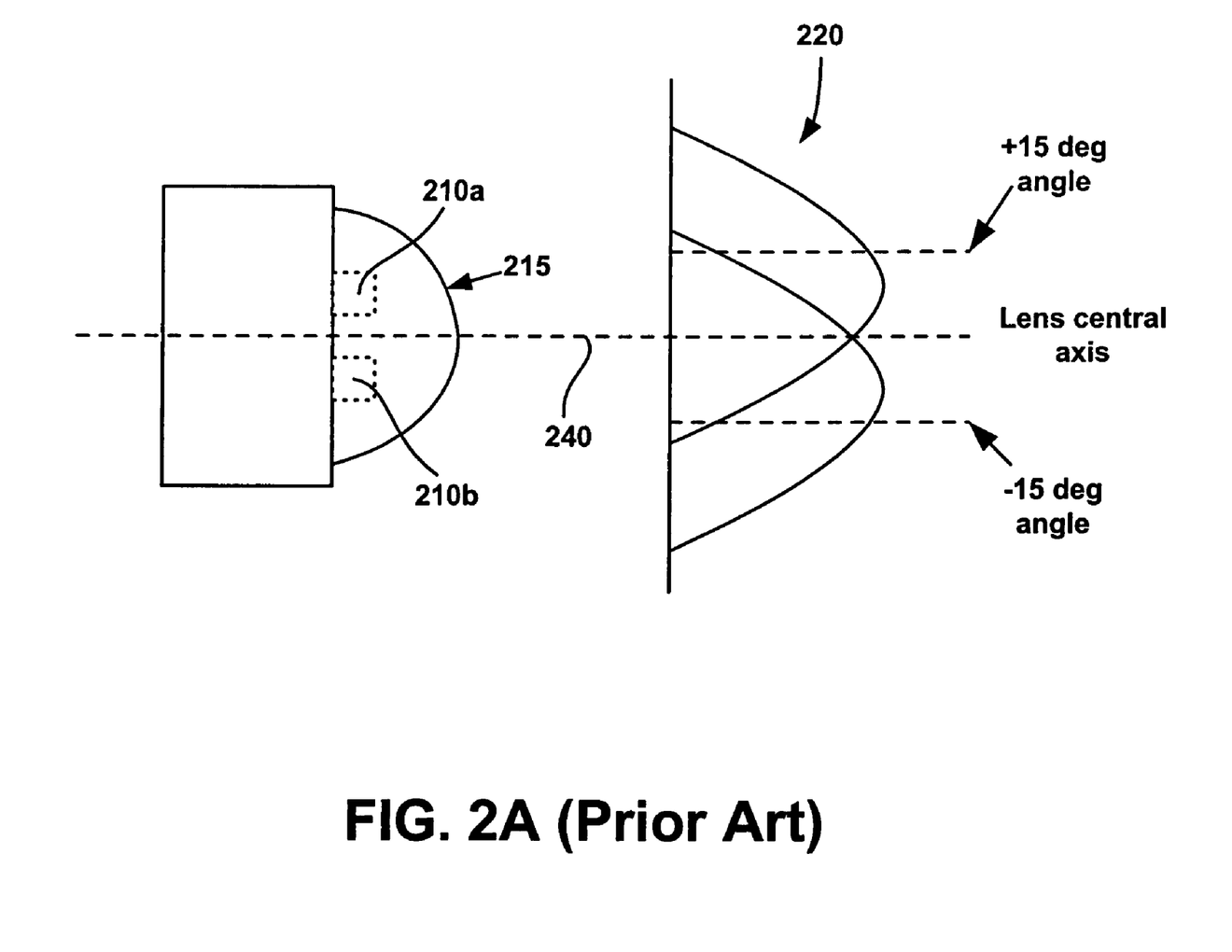
FIG. 2A is a conventional technique for adding a second LED under a single spherical lens.

However, there exists a need to transmit more information than a single LED can convey. In prior art approaches, two different LEDs are placed on the same external face of the transceiver. One such prior art approach is to place an additional lens on the transceiver to accommodate the additional LED. This solution provides a good light intensity profile, such as the one depicted in prior art FIG. 1. However, space is very limited on the transceiver and the solution of adding another lens on the external face for the second LED is undesirable because the devices that use the transceiver are often extremely small. A second prior art approach is to mount two LEDs under a single spherical lens. However, this results in an undesirable light intensity profile. Prior art FIG. 2A shows two LEDs 210a and 210b that are mounted along a vertical axis (axis not shown) under a single spherical lens 215 and the resulting light intensity profiles 220. The light from each of the LEDs 210a, 210b is asymmetrical with respect to the central axis and peaks well off the central axis 240. For example, for LED 210a the light intensity peaks at about +15 degrees from the central axis 240, and for LED 210b the light intensity peaks at about −15 degrees from the central axis 240.

Figure 2B:
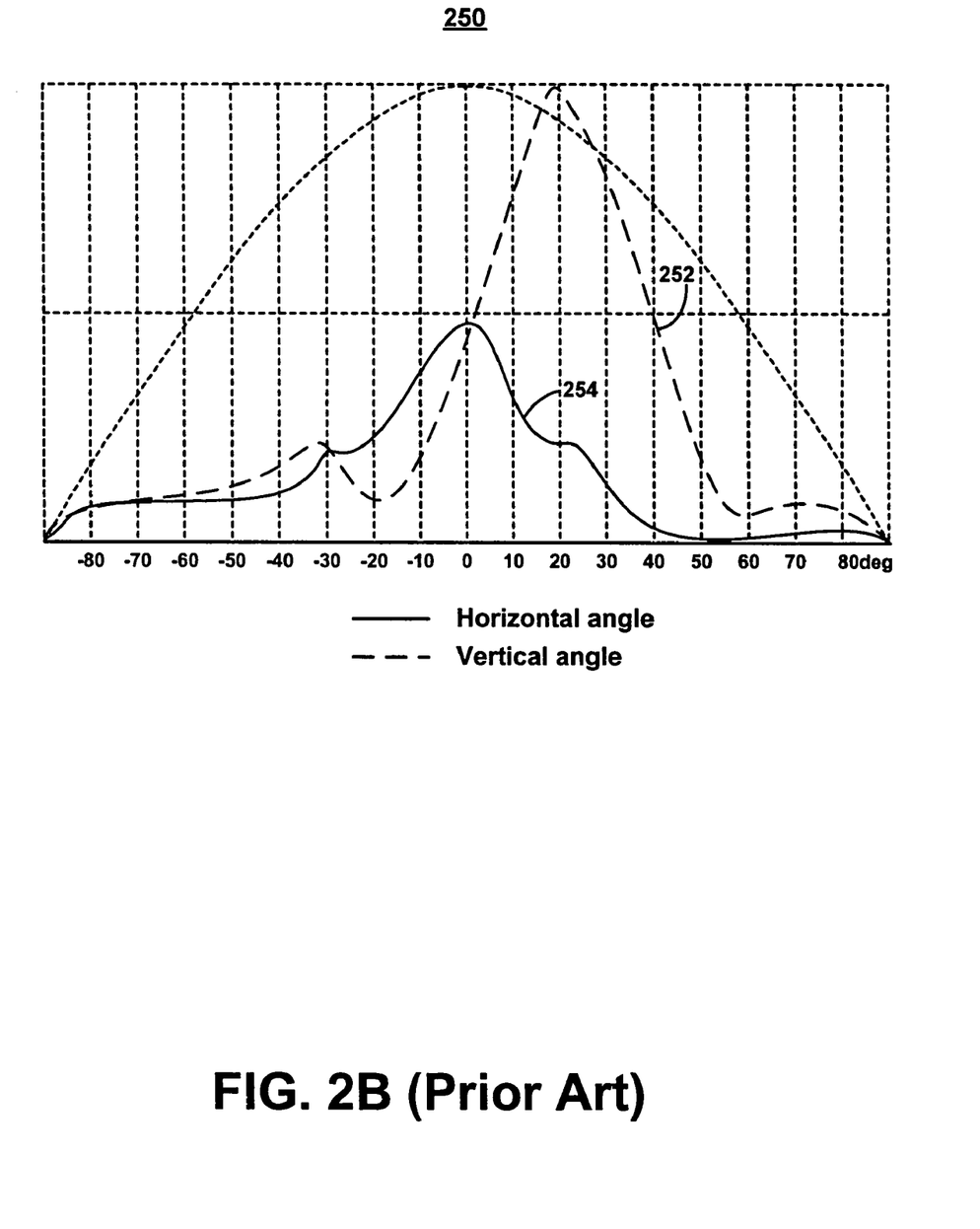
FIG. 2B is a simulated light intensity profile for the conventional technique of prior art FIG. 2A.

Prior art FIG. 2B illustrates a graph 250 of light intensity for LED 210a of prior art FIG. 2A. The light intensity of the VA curve 252 peaks at more than 15 degrees from the central axis and is relatively low at the central axis (zero degrees). That is, the intensity is less the one half the peak intensity. Moreover, the horizontal curve 254 shows a light intensity that is relatively weak at the central axis, due the fact that the LED is not centered on the central axis. Further, the cone around the central axis is undesirable because of the very low intensity of the VA curve 252 more than −5 degrees from the central axis and the very low intensity of the HA curve 254 more than 10 degrees either side of the central axis.

To comply with standards and to insure successful data transfer, the light intensity must be at a specified level in a cone around the central axis. The required light intensity is technology dependent. It is possible to increase the current supplied to the LED(s) to increase the light intensity everywhere. However, this consumes considerable extra power. As many of the devices for which the transceiver is targeted are battery operated, power consumption is a major issue.

Thus, one problem with conventional LED communication devices having at least two LEDs is that too much space is consumed on a face of the device. Another problem with such devices is that the light intensity profile is too weak near the central axis of the lens and hence data transmission suffers. A still further problem with such devices is that they consume considerable power in overcoming light intensity deficiency problems.

DISCLOSURE OF THE INVENTION

The present invention pertains to an optical communication device having multiple light sources under a single lens. An embodiment in accordance with the invention provides for an optical communication device having two light sources. The communication device has a lens that is optically coupled to the light sources. The lens is shaped to direct light from the two light sources towards a first axis of the lens. The communication device further comprises a third light source located below the approximate center of the lens.

Another embodiment provides for communication device comprising first, second, and third light sources. A lens is optically coupled to the first, second, and third light sources. The lens has an aspherical profile along a first axis and a substantially spherical profile along a second axis that is substantially perpendicular to the first axis. The first and second light sources are located substantially along the first axis.

BRIEF DESCRIPTION OF THE DRAWINGS

The accompanying drawings, which are incorporated in and form a part of this specification, illustrate embodiments according to the invention and, together with the description, serve to explain the principles of the invention.

Prior art

Prior art

Prior art

DETAILED DESCRIPTION OF THE INVENTION

In the following detailed description of embodiments in accordance with the invention, a communication device having multiple light sources under a single lens, numerous specific details are set forth in order to provide a thorough understanding of the present invention. However, the present invention may be practiced without these specific details or by using alternative elements or methods. In other instances well known methods, procedures, and components have not been described in detail as not to unnecessarily obscure aspects of embodiments in accordance with the invention.

Embodiments in accordance with the invention provide for a communication device having multiple light sources under a single lens. The lens is shaped such that the light intensity profile along the central axis of the lens is enhanced. By using a single lens for the multiple light sources, embodiments in accordance with the invention save space compared to a conventional two-lens solution. Additionally, embodiments in accordance with the invention provide for good data transmission due to the enhanced light intensity profile near the central axis of the lens. Moreover, power is saved because the current to the light sources does not need to be increased to compensate for a weak light intensity profile in a cone centered around the central axis of the lens.

An embodiment in accordance with the invention provides for a lens having an aspherical profile along a first axis and a substantially spherical profile along a second axis substantially perpendicular to the first axis. This shaping of the lens improves the light intensity profile as compared to using an entirely spherical lens. For example, this embodiment results in more light being directed toward the central axis of the lens as compared to using an entirely spherical lens. This embodiment will be discussed in conjunction with FIGS. 3A-3C, which are a top and side views of this embodiment.

Figure 3A:
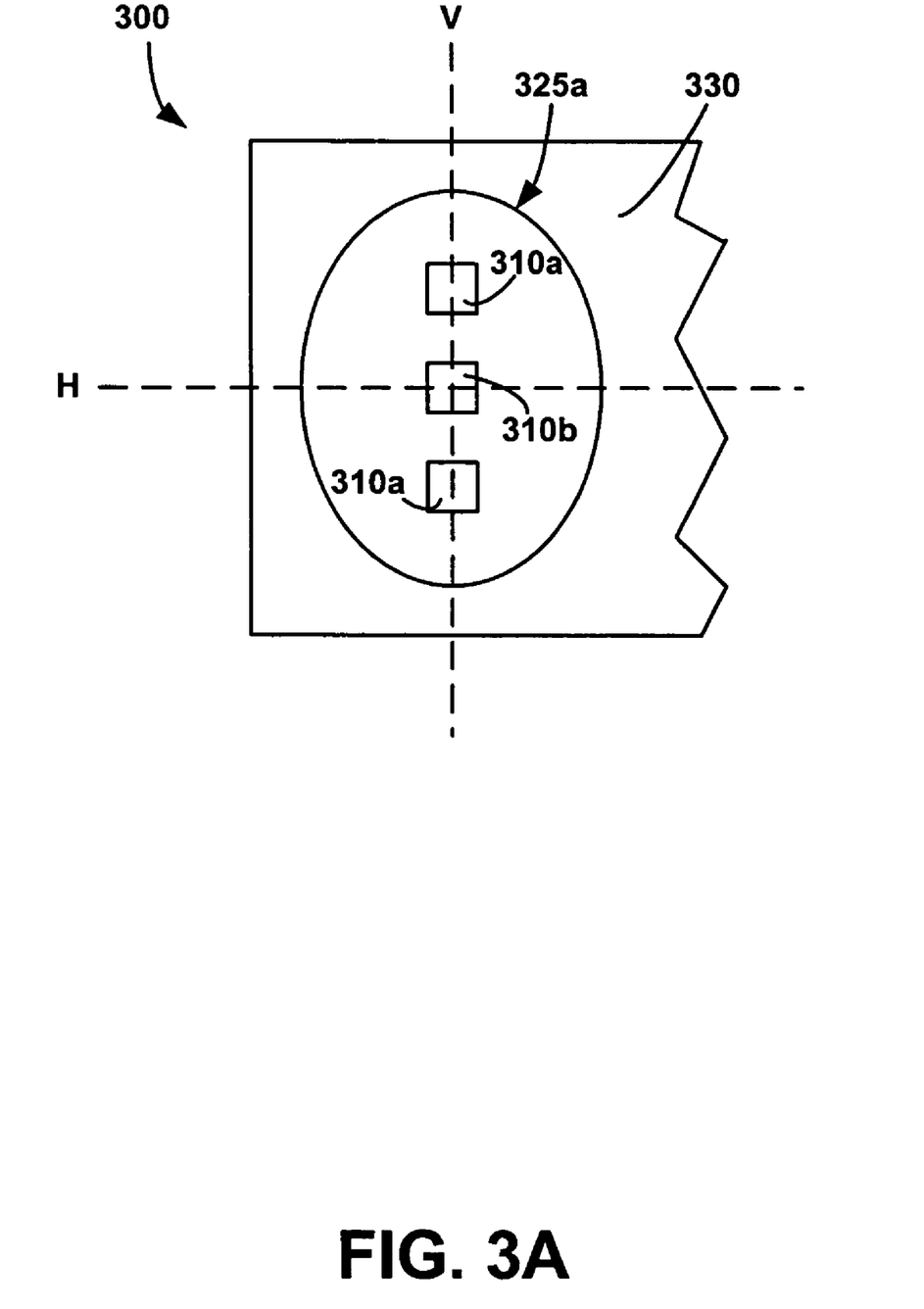
FIG. 3A is a top view of a communication device having multiple light sources under a single lens, according to an embodiment of the present invention.

FIG. 3A illustrates the top view of the communication device 300, showing the aspherical profile of the lens 325a. For reference, a horizontal axis (H) and a vertical axis (V) are shown. FIGS. 4A-4C, to be discussed below, show the light intensity over a range of −90 to 90 degrees at an arbitrary distance from the lens 325a within the planes formed by extending the axes directly out of the page. There are three light sources 310 lined up along the vertical axis. In one embodiment, the light sources 310 comprise light emitting diodes (LEDs). However, the present invention is suited to operate with other light sources. For purposes of the present application the term light source is intended to mean any electromagnetic radiation and is not limited to visible light. In the embodiment of FIG. 3A, the two outer LEDs 310a are used together to transmit the same signal. In one embodiment, the two outer LEDs 310a are operable to radiate at substantially the same wavelength. For purposes of the present application, "substantially the same wavelength" is defined as follows. According to a standards setting organization, a wavelength is assigned to a given type of signal. For example, a first wavelength is assigned for a data signal and a second wavelength is assigned for a remote control signal. The wavelengths of the separate transmissions from the two outer LEDs 310a are close enough to one another such that a photodetector or the like is able to successfully receive and decode the signals from the separate LEDs 310a as being a single transmission.

Figure 3B:
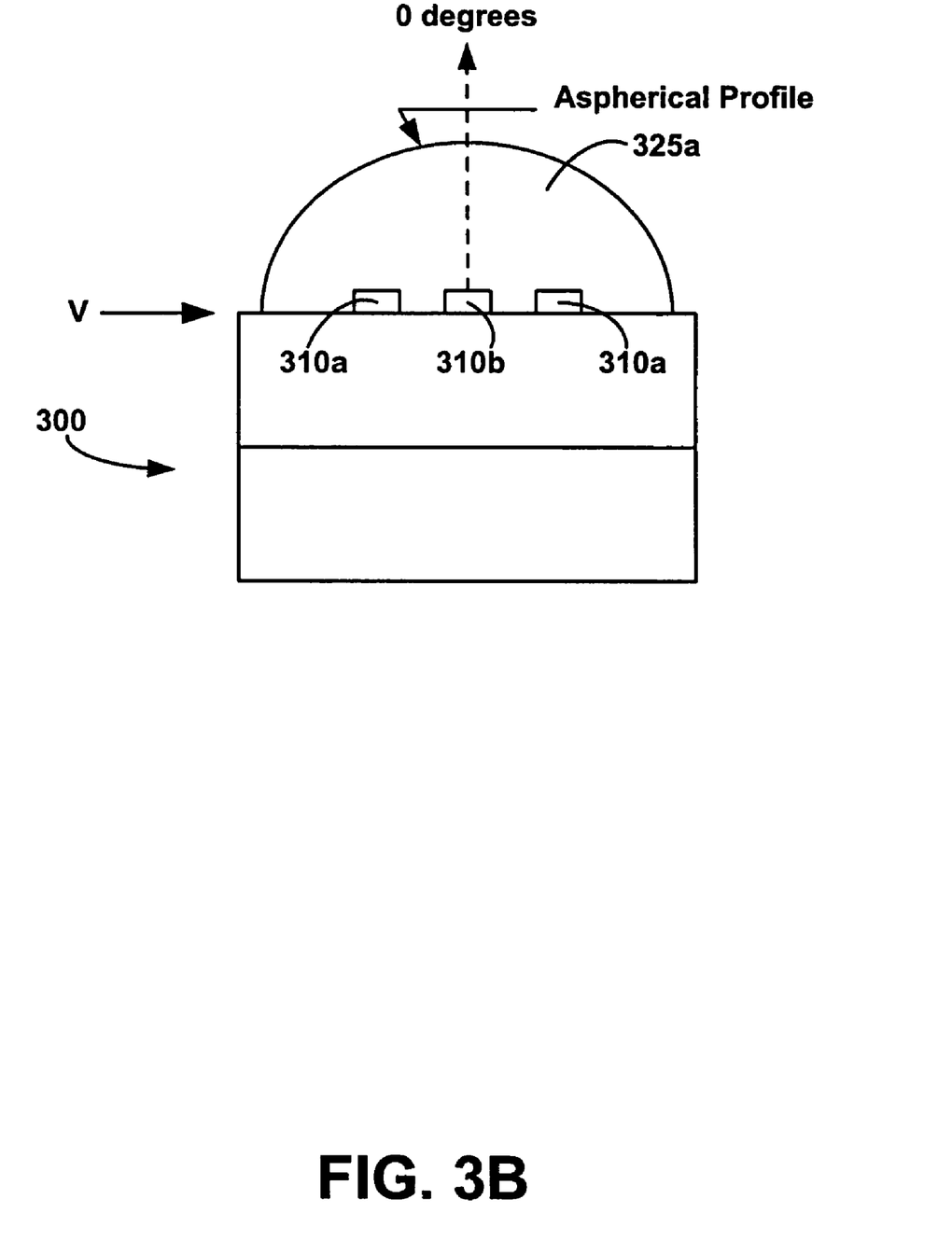
FIG. 3B is a side view along the horizontal-axis of the communication device of FIG. 3A, according to an embodiment of the present invention.

FIG. 3B illustrates a side view looking along the horizontal axis (the horizontal axis extends into and out of FIG. 3B). The three LEDs 310 are disposed along the vertical axis. The lens 325a has an aspherical profile from this perspective. The aspherical profile improves the light intensity profile of the two outer LEDs 310a without substantially compromising the light intensity profile of the central LED 310b, as will be seen in FIGS. 4A-4B. For reference, FIG. 3B shows a zero degree axis, which is also referred to as the central axis of the lens 325a.

Figure 3C:
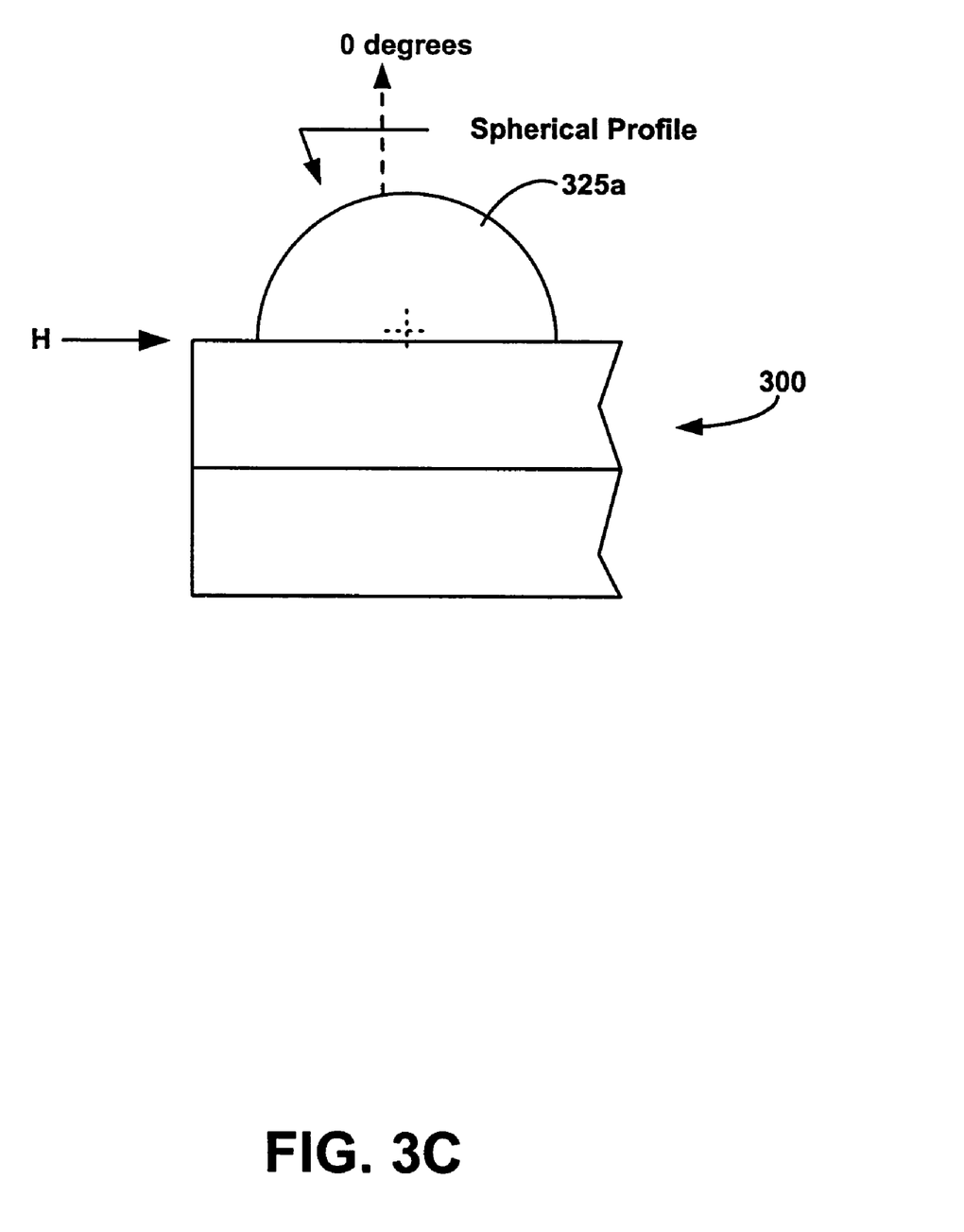
FIG. 3C is a side view along the vertical-axis of the communication device of FIG. 3A, according to an embodiment of the present invention.

FIG. 3C illustrates a side view looking from the direction of the vertical axis (vertical axis extending into and out of FIG. 3C). The lens 325a has a substantially spherical profile from this perspective. For reference, FIG. 3C shows the zero degree axis also shown in FIG. 3B.

In one embodiment, the two outer LEDs 310a transmit at a first wavelength and are designed to operate in unison. For example, both outer LEDs 310a are used to transmit the same signal. The center LED 310b transmits at a second wavelength and operates independent of the other two LEDs 310a. For example, the two outer LEDs 310a operate at 940 nanometers (nm) and are used for remote control. The center LED 310b operates at 875 nm and is used for data transfer. However, the center LED 310b may be used for remote control and the outside LEDs 310a may be used for data transfer. Further, different wavelengths may be used for the outer LEDs 310a or the center LED 310. The use of two outer LEDs 310a transmitting the same signal results in a symmetrical light intensity profile, in contrast to the prior art solution shown in prior art FIGS. 2A-2B.

Figure 4A:
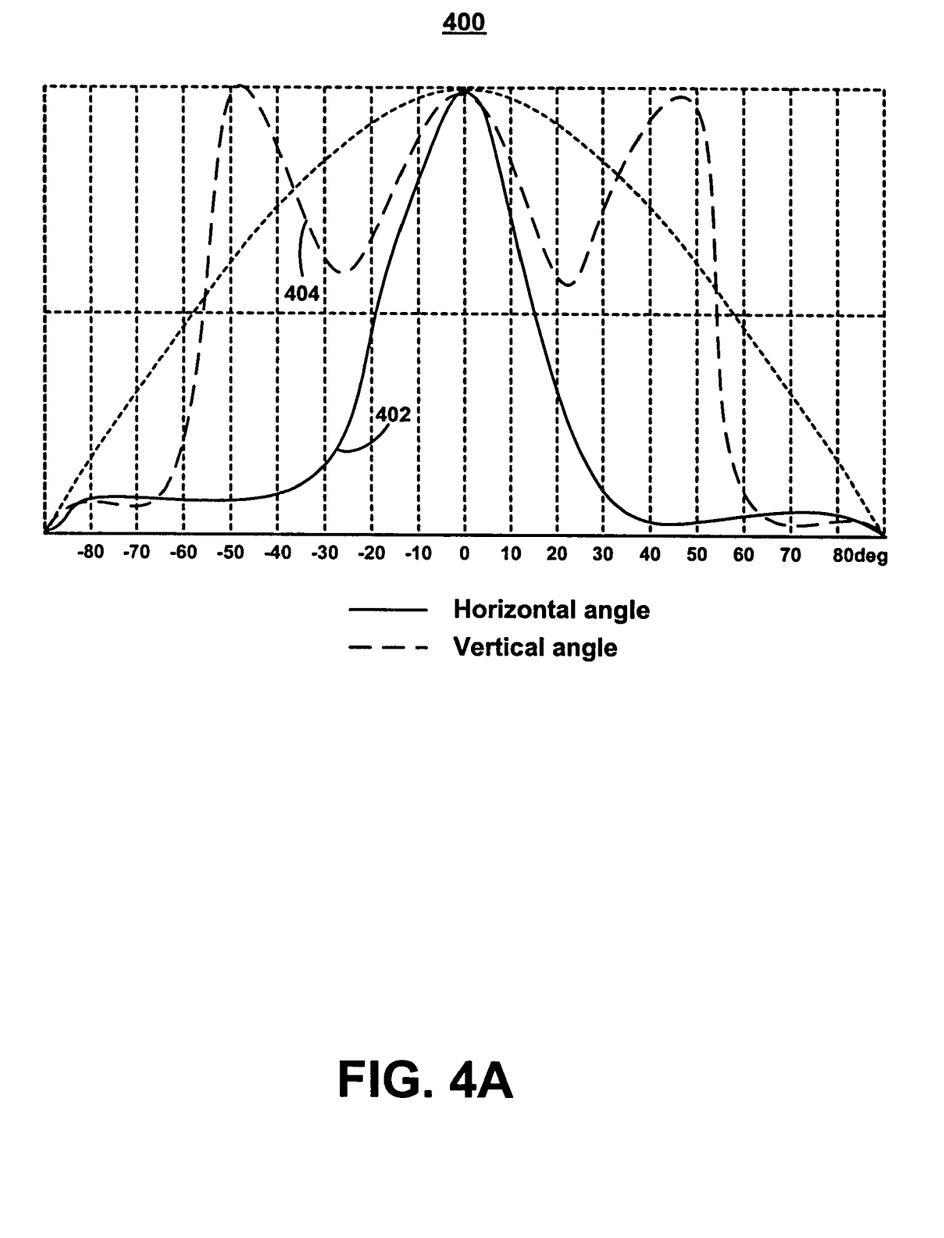
FIG. 4A is a graph illustrating a simulated light intensity profile of the outer two light sources of the embodiment of FIGS. 3A-3C.

The two LEDs 310a are positioned with respect to the central axis such that a combined light intensity profile from the two LEDs 310a is substantially symmetrical about the central axis. FIG. 4A illustrates a light intensity graph 400 for the two outer LEDs 310a of FIGS. 3A-3C. A first curve 402 illustrates light intensity for the horizontal angle (HA) and a second curve 404 illustrates light intensity for the vertical angle (VA), as defined by the axes in FIG. 3A. The HA curve 402 describes the light intensity at an arbitrary distance from the lens over a range of angles from −90 to 90 degrees in the horizontal axis of FIG. 3A. The VA curve 404 describes the light intensity at an arbitrary distance from the lens over a range of angles from −90 to 90 degrees in the vertical axis of FIG. 3A. The HA curve 402 is seen as being symmetrical about the central axis. The VA curve 404 is also seen as being symmetrical about the central axis, but with a different shape than the HA curve 402. Thus, there are two separate profiles oriented 90 degrees with respect to one another that are each symmetrical with respect to the central axis. For purposes of the present application, approximately symmetrical about the central axis is meant to mean that there are two profiles oriented 90 degrees with respect to one another that are each approximately symmetrical about the central axis. The term "approximately symmetrical" is not intended to be limited to a specific numerical value.

Referring again to FIG. 3A, the two outer LEDs 310a are located substantially equidistant from the central LED 310. By "substantially equidistant" it is meant that the amount of variation from exact equidistance is such that the light intensity profile is still suitable for the intended purpose of the transceiver.

In the present embodiment, the symmetry is with respect to a central axis of the lens 325a. The symmetry is so chosen because of the way in which the transceiver 300 is designed to be pointed when the LEDs 310 are transmitting. However, the present invention is not limited to the profile being symmetrical about the central axis. Rather, the symmetry may be about any axis. The symmetrical light intensity profile is an improvement over the asymmetrical light intensity profile shown in prior art FIGS. 2A-2B.

Still referring to FIG. 3B, the lens 325a is shaped to direct light from the two LEDs 310a towards the central axis. Directing the light intensity towards the central axis increases the light intensity in the cone around the central axis as compared to not shaping the lens to so direct the light, such as the conventional solution of using an entirely spherical lens shown in prior art FIG. 2A. Thus, this embodiment in accordance with the present invention provides for improved data communication and allows the LEDs 310 to be operated with less power than conventional solutions. The third LED 310b is located below the approximate center of the lens 325a and is used to transmit a different signal than the two outer LEDs 310a. However, it is not required that he third LED 310b be located below the approximate center of the lens 325a.

To demonstrate the improvement in light intensity profile over conventional techniques, a simulated light intensity profile is shown in FIG. 4A. The HA curve 402 demonstrates that the light intensity within 20 degrees of the central axis is at least one-half the peak signal. Further, the HA curve 402 is symmetrical about the central axis, as opposed to some conventional solutions. A symmetrical light intensity is more efficient than the asymmetrical light intensity associated with some conventional techniques. Hence, embodiments in accordance with the present invention eliminate the need to increase the current to the LED to overcome undesirable low intensity near the central cone. The HA curve 402 has a single peak centered along the central axis of the lens (e.g., along the zero degree angle) and has relatively low intensity 30 degrees either side of the central axis. Thus, the light intensity is desirably concentrated near the central axis.

The VA curve 404 of FIG. 4A is never less than 50 percent of the maximum light intensity within a range of −50 to 50 degrees of the central axis. The VA curve 404 is also desirably symmetrical about the central axis. Thus, if the central axis of the transmitting device is pointing within 50 degrees of the photodetector of a receiving device located along the vertical axis, the receiving device will receive a signal that is more than 50 percent of the maximum signal if the photodetector is optimally aligned. It is evident from VA curve 404 and HA curve 402 that a cone around the central axis has a very desirable light intensity. The VA curve 404 has three peaks, which are a result of the shape of the lens and the position of the light sources. One peak of the VA curve 404 is centered along the central axis of the lens (e.g., along the zero degree angle) and two are on either side peaking about 40-50 degrees from the central axis.

The shape of the light intensity curves in FIG. 4A can be understood by examining the shape of the lens 325a and position of the light sources 310 in FIGS. 3A-3C. The HA curve 402 in FIG. 4A shows a single peak. FIG. 3C shows that the lens 325a has a substantially spherical shape along the horizontal axis. For purposes of the present application, "substantially spherical" is defined as follows. In one embodiment, this shape has a single focal point, which results in the single peak. However, in the vertical direction, the lens 325a is aspherical, as seen in FIG. 3B. The aspherical lens 325a has two focal points. The light from each LED 310a results in two peaks. However, one peak from each LED 310a combines to form the central peak of VA curve 404 of FIG. 4A. Thus, two LEDs 310a radiating at the same time result in the VA curve 404 with three peaks. However, the present invention is not limited to using the combination of an aspherical profile in a first axis with a spherical profile a second axis that is perpendicular to the first. Further, the lens may have any number of foci in either the horizontal or vertical axis. Thus, there may be any number of peaks in the VA curve 404 and the HA curve 402.

Figure 4B:
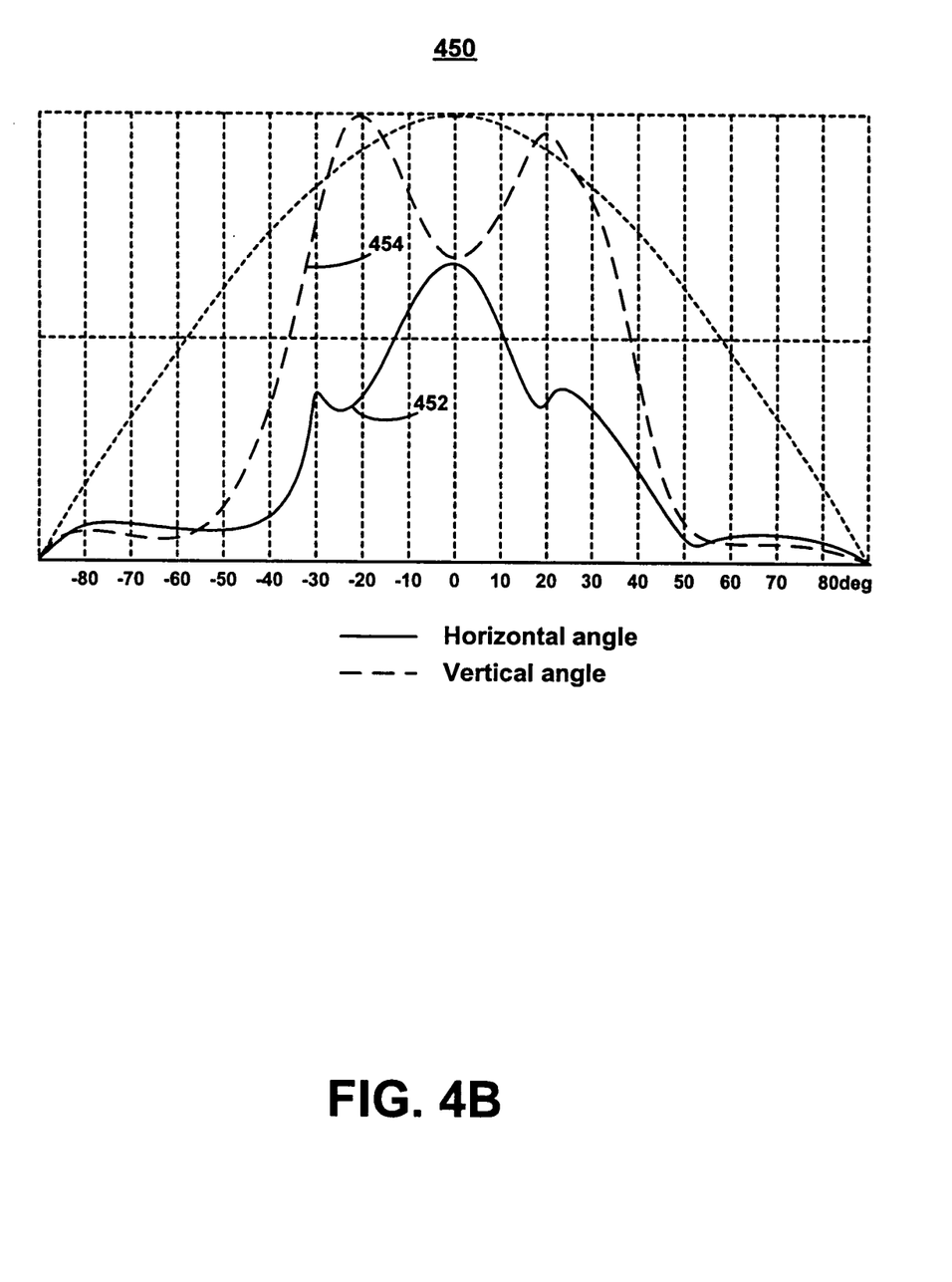
FIG. 4B is a graph illustrating a simulated light intensity profile of the central light source of the embodiment of FIGS. 3A-3C.

FIG. 4B illustrates a light intensity graph 450 for the central LED 310b of FIGS. 3A-3C. A first curve 452 illustrates light intensity for the horizontal angle and a second curve 454 illustrates light intensity for the vertical angle, as defined by the axes in FIG. 3A. Both curves show desirable results. That is, the light intensity profile is symmetrical about the central axis and the light intensity is relatively high near the central axis for both curves 452, 454. Thus, it is evident that the light intensity will be desirable within a cone centered at the central axis. Referring to the HA curve 452, a single peak is centered along the central axis of the lens (e.g., along the zero degree angle) and is relatively low at 30 degrees to either side of the central axis. Thus, the light intensity is desirably concentrated near the central axis and power is conserved by not requiring delivery of additional compensating current to the LEDs. Moreover, the intensity is not too narrowly directed to the central axis. For example, the intensity at 25 degrees on either side of the central axis is about half the intensity of the peak at the central axis.

Referring still to FIG. 4B, the vertical light intensity curve 454 has two peaks, in contrast to the VA curve 404 in FIG. 4A. While there is no central peak in this case, the light intensity within 40 degrees of the central axis is always at least 50 percent of the maximum intensity. Moreover, there are two peaks on either side of the central axis at about 20 degrees from the central axis. Thus, along the vertical axis the light intensity within 40 degrees from the central axis is always greater than 50 percent the maximum intensity.

The shape of the light intensity curves in FIG. 4B can be understood by referring to the shape of the lens 325a and position of the light sources in FIGS. 3A-3C. The HA curve 452 in FIG. 4B shows a single peak. FIG. 3C shows that the lens 325a has a spherical shape in the horizontal direction. The spherical shape of this embodiment has a single focal point, which results in the single peak. However, in the vertical direction, the lens 325a is aspherical, as seen in FIG. 3B. The aspherical lens 325a of this embodiment has two focal points. With a single LED 310b radiating from a point under the center of the lens 325a, the result is two peaks in the VA curve 454. While the shape of the lens 325a results in the two peaks being off the central axis, the intensity is still very high along the central axis.

Figure 5A:
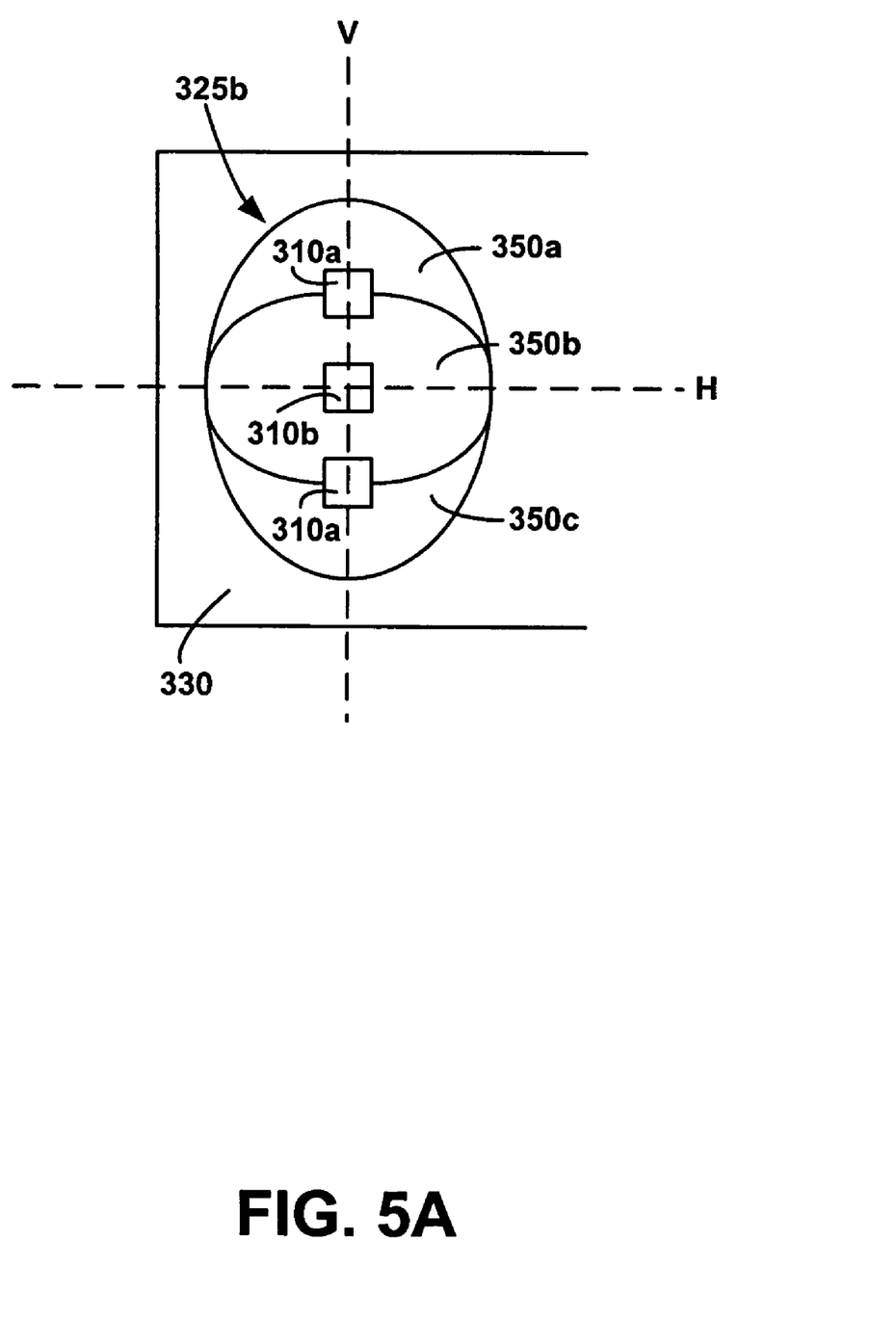
FIG. 5A is a top view of a communication device having multiple light sources under a single lens, according to an embodiment of the present invention.
Figure 5B:
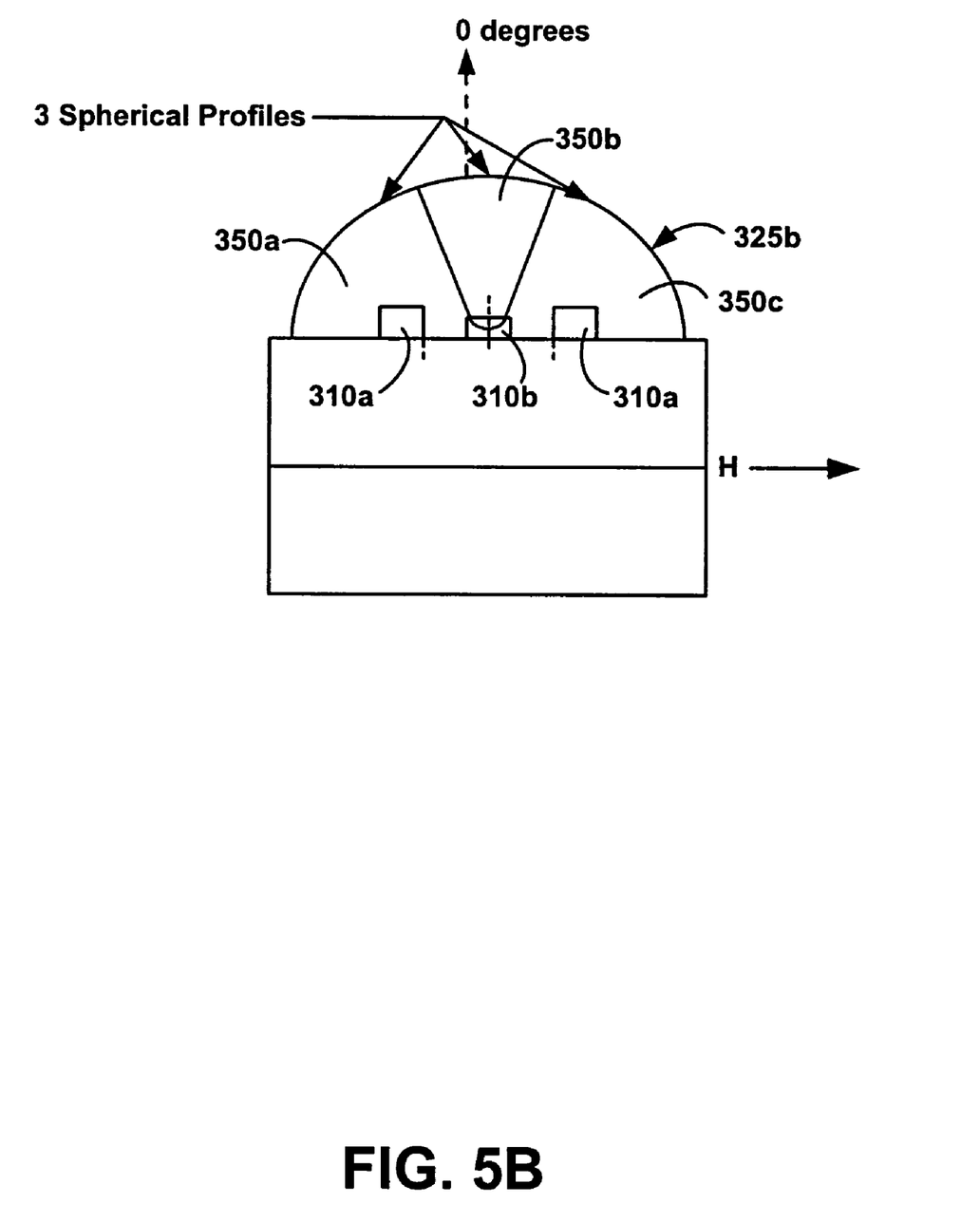
FIG. 5B is a side view of the communication device of FIG. 5A along the horizontal-axis, according to an embodiment of the present invention.
Figure 5C:
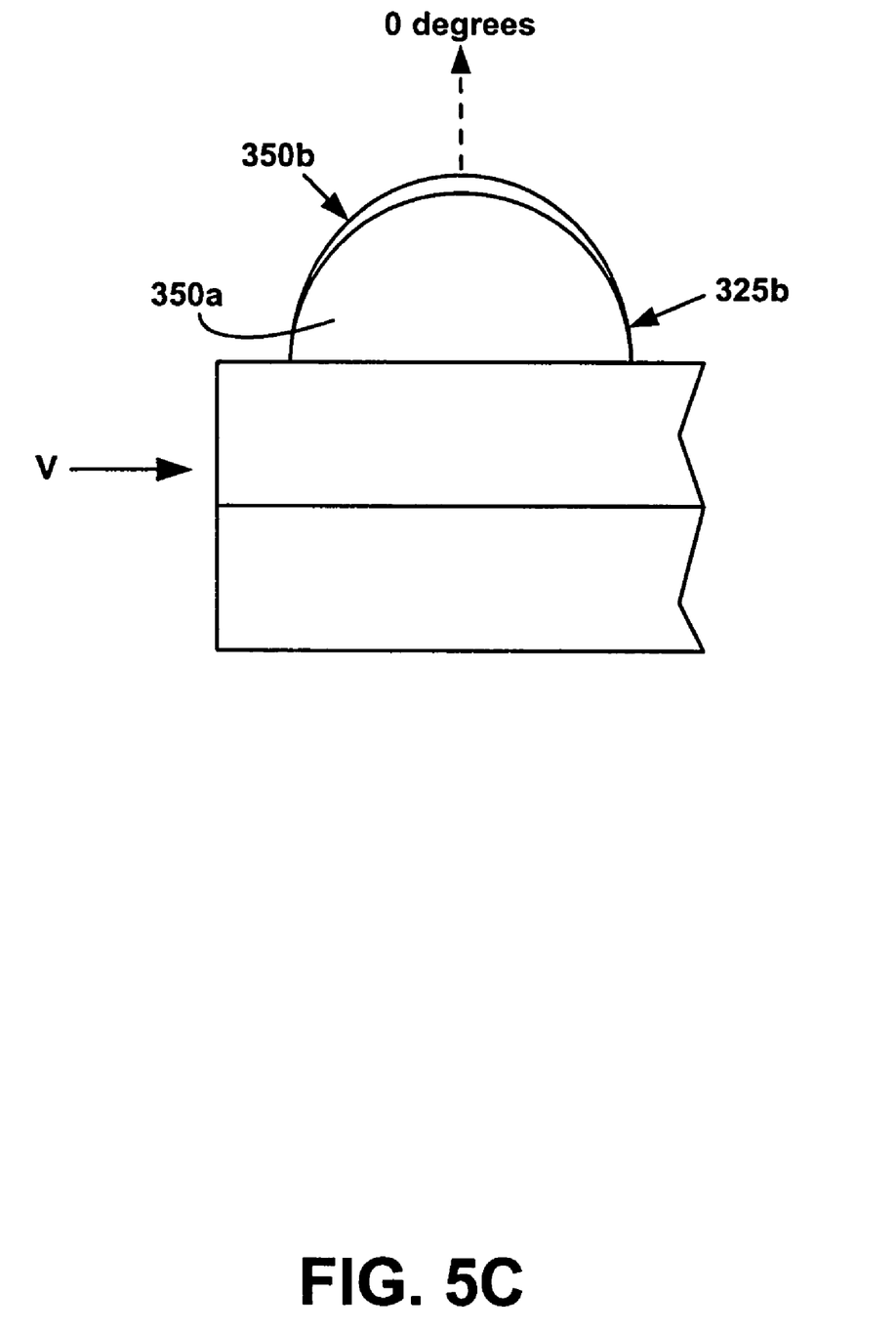
FIG. 5C is a side view of the communication device of FIG. 5A along the vertical-axis, according to an embodiment of the present invention.

FIGS. 5A-5C illustrates an embodiment in which the lens 325b is formed from three substantially spherically shaped sections 350a, 350b, and 350c. FIG. 5A illustrates the top view, showing that the three spherical sections 350a, 350b, and 350c result in an overall shape that is aspherical, although not identical to FIG. 3A. In this embodiment, the three spheres from which the spherical sections 350a, 350b, and 350c are formed have the same radius, with their centers in different locations. However, the present invention is not limited to each sphere having the same radius. For purposes of the present application, the term "substantially spherically shaped sections" is not intended to be limited to an exact spherical shape.

For reference, a horizontal axis (H) and a vertical axis (V) are shown. As with the embodiment in FIGS. 3A-3C, this embodiment also has three LEDs 310 lined up along an axis in the vertical direction. The two outer LEDs 310a are operable to radiate at substantially the same wavelength. The lens 325b is shaped to direct light from the two LEDs 310a towards the central axis. The third LED 310b is located below the approximate center of the lens 325b. However, the third LED 310b is not required to be located below the approximate center of the lens 325b. Moreover, the two outer LEDs 310a do not have to be located along an axis in the vertical direction. More generally, embodiments according to the present invention have a plurality of light sources in any configuration under a suitably shaped lens such that the light intensity profile is directed towards the central axis and/or the light intensity profile is symmetrical about the central axis in at least one of the horizontal axis or the vertical axis.

FIG. 5B illustrates a side view looking from the direction of the horizontal axis. The three LEDs 310 are disposed along the vertical axis. The three spherical sections 350a, 350b, and 350c are clearly discernable from this perspective. The overall shape of the lens 325b from this perspective is aspherical. A zero degree axis is shown for reference to FIGS. 6A-6B.

FIG. 5C illustrates a side view looking from the direction of the vertical axis. The middle spherical section 350b can be seen above and behind one of the edge spherical sections 350a. From this perspective, the overall shape of the lens 325b is substantially spherical, as the shape is dominated by the spherical section 350a on the near edge, with the other spherical sections 350b and 350c being hidden. A zero degree axis is shown for reference to FIGS. 6A-6B.

As with the embodiment in FIGS. 3A-3C, the two outer LEDs 310a transmit at a first wavelength and are designed to operate in unison. For example, both outer LEDs 310a are used to transmit the same signal. The center LED 310b transmits at a second wavelength and operates independent of the other two LEDs 310a. For example, the two outer LEDs 310a operate at 875 nm and are used for data transfer, and the center LED 310b operates at 940 nm and is used for remote control. The roles of the LEDs 310 are switched from the embodiment in FIGS. 3A-3C to illustrate that the use, wavelengths, and construction of the LEDs 310 are not limited to a specific implementation. Moreover, the different LEDs are not constrained to work at the same power or intensity level.

Figure 6A:
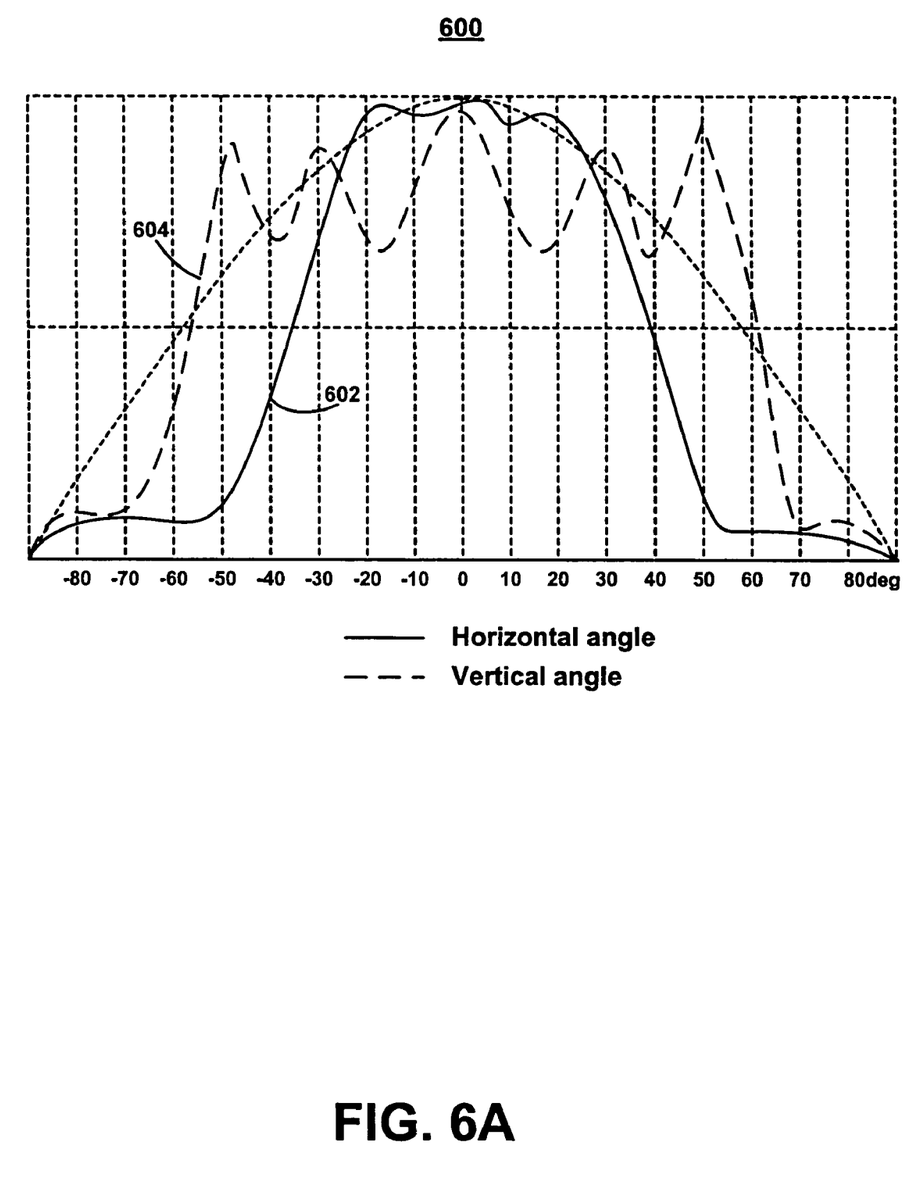
FIG. 6A is a graph illustrating a simulated light intensity profile of the outer two light sources of the embodiment of FIGS. 5A-5C.

To demonstrate the improvement in light intensity profile over conventional techniques for this embodiment, a simulated light intensity profile is shown. FIG. 6A illustrates a light intensity graph 600 for the two outer LEDs 310a of FIGS. 5A-5C. A first curve 602 illustrates light intensity for the horizontal angle and a second curve 604 illustrates light intensity for the vertical angle, as defined by the axes in FIG. 5A. Both curves 602 and 604 show desirable results. That is, the HA curve 602 shows that the light intensity is desirably concentrated near the central axis. As a result, power is conserved by not requiring the delivery of additional compensating current to the LEDs. For example, the HA curve 602 has a peak with ripples centered along the central axis of the lens (e.g., along the zero degree angle) and is relatively low 40 degrees either side of the center. Moreover, the intensity is not directed too narrowly towards the central axis.

As with the HA curve 602, the VA curve 604 in FIG. 6A is symmetrical about the central axis. Moreover, the light intensity in the vertical angle is always at least 50 percent of the maximum within 50 degrees of the central axis. Thus, it is evident from examining VA curve 604 and HA curve 602 that a cone centered along the central axis has a desirable light intensity profile. The VA curve 604 of FIG. 6A has a five peaks. One peak is centered along the central axis of the lens (e.g., along the zero degree angle) and four are on either side peaking about 27 and 50 degrees from the central axis.

The shape of the light intensity curves 602, 604 in FIG. 6A can be understood by examining the shape of the lens 325b and position of the light sources in FIGS. 5A-5C. In this embodiment, there are three spherical sections 350a, 350b, and 350c, each of which has a single focal point. Note that the vertical axis (V) in FIG. 5A runs though all three spherical sections 350a, 350b, and 350c. The five peaks of the vertical light intensity curve 604 can be understood as being the result of two LEDs 310a radiating through three spherical sections 350a, 350b, and 350c, in the configuration shown. Each LED 310a alone would result in three peaks, but two of those combine to form the central peak of the VA curve 604. Thus, the light intensity near the central axis is enhanced. The HA curve 602 in FIG. 6A shows a single peak with ripples. Note that the horizontal axis (H) runs through the central spherical section 350b. While the light from each of the two outer LEDs 310a passes through each of the three spherical sections 350a, 350b, and 350c; the central spherical section 350b is the most significant for producing the shape of the HA curve 602. However, the ripples in the HA curve 604 caused by the outer spherical sections 350a and 350c do not degrade the quality of the signal.

Figure 6B:
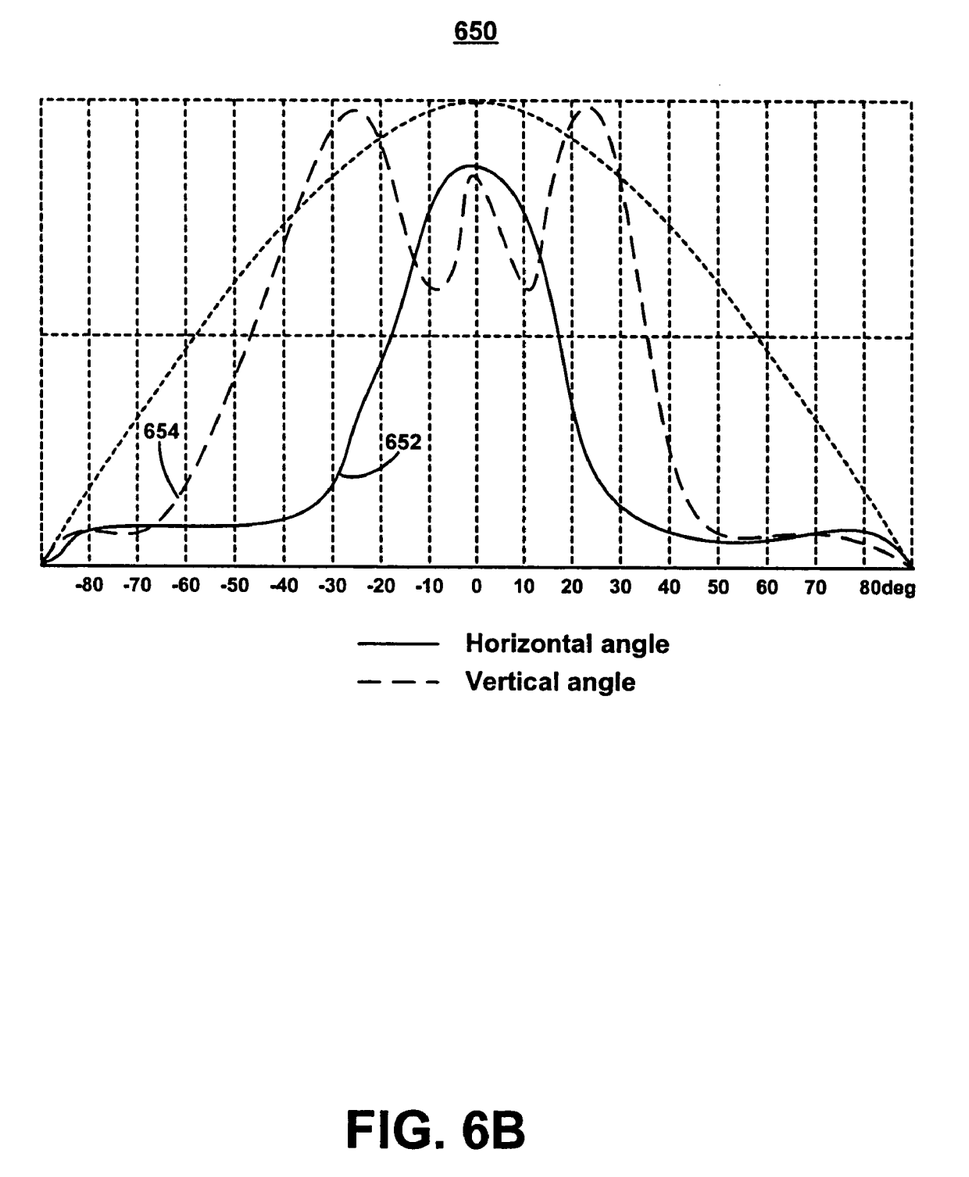
FIG. 6B is a graph illustrating a simulated light intensity profile of the central light source of the embodiment of FIGS. 5A-5C.

FIG. 6B illustrates a light intensity graph 650 for the central LED 310b in FIGS. 5A-5C. A first curve 652 illustrates light intensity for the horizontal angle and a second curve 654 illustrates light intensity for the vertical angle, as defined by the axis in FIGS. 5A. Both curves show desirable results. That is, the HA curve 652 has a single peak centered along the central axis of the lens (e.g., along the zero degree angle) and is relatively low 30 degrees either side of the center. Thus, the light intensity is desirably concentrated near the central axis and power is conserved by not requiring the delivery of additional compensating current to the LEDs. Moreover, the intensity is not directed too narrowly to the central axis. For example, intensity at 20 degrees on either side of the central axis is quite high relative to the center peak. Note also, that the light intensity is symmetrical, as opposed to conventional solutions.

The VA curve 654 has three peaks, in contrast to the VA curve 454 in FIG. 4B, which shows two peaks. In the present embodiment, there is a central peak, with the light intensity on the central axis being substantial. Moreover, the two peaks on either side of the central axis are only about 25 degrees from the central axis. Thus, the light intensity is substantial over a significant cone around at the central axis.

For example, the intensity in the vertical angle is always at least 50 percent of the maximum within 30 degrees of the central axis. As with the HA curve 652, the light distribution of the VA curve 654 is symmetrical about the central axis.

The shape of the light intensity curves in FIG. 6B can be understood by examining the shape of the lens 325b and position of the light sources in FIGS. 5A-5C. The embodiment shown in FIGS. 5A-5C has three spherical sections 350a, 350b, and 350c, each with a single focal point. In this embodiment, the centers of the spheres that form the spherical sections 350a, 350b, and 350c are located at different points on the vertical axis. Thus, the one centrally located LED 310b results in three peaks in the vertical axis and a single peak in the horizontal axis. However, the present invention is well suited to using a different number of spherical sections, in which case there will be a different numbers of peaks in the vertical light intensity.

The present invention is not limited to using an asymmetrical lens profile or three spherical sections to cause the desired light intensity profiles in which the light intensity near the central axis is enhanced. Embodiments in accordance with the invention are well suited to other lens shapes. Moreover, embodiments vary the thickness of the lens in order to create the desired light intensity profiles in which the light intensity near the central axis is enhanced. For example, rather than shaping the lens aspherically or using multiple spherical sections, the thickness of the lens is varied to direct light from LEDs towards the central axis.

While the present invention has been described in particular embodiments, it should be appreciated that the present invention should not be construed as limited by such embodiments, but rather construed according to the below claims.

We claim:

1. A single lens multi-channel optical communication transmitter, comprising:
   at least first and second light sources, the first light source being configured to emit light of a first wavelength, the second light source being configured to emit light of a second wavelength different from the first wavelength; the first and second light sources being disposed along a vertical axis; and
   a single lens having an optical axis, a vertical axis and the horizontal axis associated therewith, the horizontal and vertical axes being perpendicular to one another and also to the optical axis, the lens being positioned in respect of the first and second light sources to collimate and direct forwardly light emitted thereby, the lens comprising an outer lens surface located distally from the first and second light sources, the outer lens surface having an aspherical profile along the vertical axis and a spherical profile along the horizontal axis, the outer lens surface forming a convex shape of positive slope at all points along at least central portions of the aspherical and spherical profiles thereof, the lens covering and enveloping the first and second light sources;
   wherein the first and second light sources are positioned in respect of the optical axis and the lens such that a combined light intensity profile from the first and second light sources is approximately symmetrical about the optical axis, and the lens is shaped and configured to enhance light intensity near the optical axis.

2. The single lens multi-channel optical communication transmitter of claim 1, wherein said transmitter further comprises a third light source disposed along the vertical axis, the third light source also being covered and enveloped by the lens.

3. The single lens multi-channel optical communication transmitter of claim 2, wherein the first and second light sources are located substantially equidistant along the vertical axis from the third light source.

4. The single lens multi-channel optical communication transmitter of claim 2, wherein the third light source emits light of a third wavelength different from the first and second wavelengths.

5. The single lens multi-channel optical communication transmitter of claim 2, wherein the third light source comprises a third light emitting diode.

6. The single lens multi-channel optical communication transmitter of claim 2, wherein the third light source is operable as at least one of a remote signal and a data signal.

7. The single lens multi-channel optical communication transmitter of claim 2, wherein the lens has first, second and third focal points disposed along the vertical axis associated, respectively, with the first, second and third light sources.

8. The single lens multi-channel optical communication transmitter of claim 1, wherein the first and second light sources comprise first and second light emitting diodes.

9. The single lens multi-channel optical communication transmitter of claim 1, wherein the lens comprises first and second substantially spherical sections associated, respectively, with first and second focal points corresponding to the first and second light sources, respectively.

10. The single lens multi-channel optical communication transmitter of claim 9, wherein the transmitter further comprises a third light source disposed along the vertical axis and the lens further comprises a third substantially spherical section associated with a third focal point corresponding to the third light source.

11. The single lens multi-channel optical communication transmitter of claim 1, wherein the first and second light sources are individually operable as at least one of a remote control signal and a data signal.

12. The single lens multi-channel optical communication transmitter of claim 1, wherein the transmitter further comprises receiver circuitry and at least one photosensor operably connected thereto.

13. The single lens multi-channel optical communication transmitter of claim 1, wherein the lens has first and second focal points disposed along the vertical axis associated, respectively, with the first and second light sources.

14. The single lens multi-channel optical communication transmitter of claim 1, wherein the thickness of the lens varies across the surface thereof to concentrate light from the first and second light sources towards the optical axis.

* * * * *